US009368329B2

(12) United States Patent
Valcore, Jr. et al.

(10) Patent No.: US 9,368,329 B2
(45) Date of Patent: Jun. 14, 2016

(54) METHODS AND APPARATUS FOR SYNCHRONIZING RF PULSES IN A PLASMA PROCESSING SYSTEM

(75) Inventors: John C. Valcore, Jr., San Jose, CA (US); Bradford J. Lyndaker, Danville, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/550,719

(22) Filed: Jul. 17, 2012

(65) Prior Publication Data

US 2013/0214828 A1 Aug. 22, 2013

Related U.S. Application Data

(60) Provisional application No. 61/602,041, filed on Feb. 22, 2012.

(51) Int. Cl.
*H01J 37/32* (2006.01)
(52) U.S. Cl.
CPC ..... *H01J 37/32183* (2013.01); *H01J 37/32146* (2013.01); *H01J 37/32174* (2013.01)
(58) Field of Classification Search
CPC ..................... H01J 37/32146; H01J 37/32183; H01J 37/32174; H01J 37/32137
See application file for complete search history.

(56) References Cited

U.S. PATENT DOCUMENTS

| 4,353,777 A | 10/1982 | Jacob |
| 4,377,961 A | 3/1983 | Bode |
| 4,420,790 A | 12/1983 | Golke et al. |
| 4,454,001 A | 6/1984 | Sternheim et al. |
| 4,457,820 A | 7/1984 | Bergeron et al. |
| 4,500,563 A | 2/1985 | Ellenberger et al. |
| 5,474,648 A | 12/1995 | Patrick et al. |

(Continued)

FOREIGN PATENT DOCUMENTS

| CN | 101110347 A | 1/2008 |
| JP | 2001-127045 A | 5/2001 |

(Continued)

OTHER PUBLICATIONS

Thorsten, Lill et al., "Controlling ION Energy Within A Plasma Chamber", U.S. Appl. No. 13/930,138, filed Jun. 28, 2013.

(Continued)

*Primary Examiner* — Jeffrie R Lund
*Assistant Examiner* — Yuechuan Yu
(74) *Attorney, Agent, or Firm* — Martine Penilla Group, LLP

(57) ABSTRACT

A synchronized pulsing arrangement for providing at least two synchronized pulsing RF signals to a plasma processing chamber of a plasma processing system is provided. The arrangement includes a first RF generator for providing a first RF signal. The first RF signal is provided to the plasma processing chamber to energize a plasma therein, the first RF signal representing a pulsing RF signal. The arrangement also includes a second RF generator for providing a second RF signal to the plasma processing chamber. The second RF generator has a sensor subsystem for detecting values of at least one parameter associated with the plasma processing chamber that reflects whether the first RF signal is pulsed high or pulsed low and a pulse controlling subsystem for pulsing the second RF signal responsive to the detecting the values of at least one parameter.

27 Claims, 4 Drawing Sheets

(56) References Cited

U.S. PATENT DOCUMENTS

| | | |
|---|---|---|
| 5,479,340 A | 12/1995 | Fox et al. |
| 5,556,549 A | 9/1996 | Patrick et al. |
| 5,571,366 A | 11/1996 | Ishii et al. |
| 5,689,215 A | 11/1997 | Richardson et al. |
| 5,694,207 A | 12/1997 | Hung et al. |
| 5,737,177 A | 4/1998 | Mett et al. |
| 5,764,471 A | 6/1998 | Burkhart |
| 5,788,801 A | 8/1998 | Barbee et al. |
| 5,810,963 A | 9/1998 | Tomioka |
| 5,812,361 A | 9/1998 | Jones et al. |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven et al. |
| 5,980,768 A | 11/1999 | Abraham |
| 5,989,999 A | 11/1999 | Levine et al. |
| 6,020,794 A | 2/2000 | Wilbur |
| 6,021,672 A | 2/2000 | Lee |
| 6,042,686 A | 3/2000 | Dible et al. |
| 6,048,435 A | 4/2000 | DeOrnellas et al. |
| 6,110,214 A | 8/2000 | Klimasauskas |
| 6,157,867 A | 12/2000 | Hwang et al. |
| 6,198,616 B1 | 3/2001 | Dahimene et al. |
| 6,246,972 B1 | 6/2001 | Klimasauskas |
| 6,441,555 B1 | 8/2002 | Howald et al. |
| 6,472,822 B1 | 10/2002 | Chen et al. |
| 6,522,121 B2 | 2/2003 | Coumou |
| 6,535,785 B2 | 3/2003 | Johnson et al. |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,781,317 B1 | 8/2004 | Goodman |
| 6,823,815 B2 | 11/2004 | Han et al. |
| 6,838,635 B2 | 1/2005 | Hoffman et al. |
| 6,862,557 B2 | 3/2005 | Jones et al. |
| 6,873,114 B2 | 3/2005 | Avoyan et al. |
| 6,972,524 B1 | 12/2005 | Marakhtanov et al. |
| 6,983,215 B2 | 1/2006 | Coumou et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,323,116 B2 | 1/2008 | Guiney et al. |
| 7,359,177 B2 | 4/2008 | Yang et al. |
| 7,361,287 B2 | 4/2008 | Laermer |
| 7,375,038 B2 | 5/2008 | Kumar |
| 7,435,926 B2 | 10/2008 | Jafarian-Tehrani |
| 7,459,100 B2 | 12/2008 | Kiemasz et al. |
| 7,480,571 B2 | 1/2009 | Howald et al. |
| 7,505,879 B2 | 3/2009 | Tomoyasu et al. |
| 7,586,100 B2 | 9/2009 | Raj et al. |
| 7,728,602 B2 | 6/2010 | Valcore et al. |
| 7,764,140 B2 | 7/2010 | Nagarkatti et al. |
| 7,768,269 B2 | 8/2010 | Piptone et al. |
| 7,858,898 B2 | 12/2010 | Bailey, III et al. |
| 7,967,944 B2 | 6/2011 | Shannon et al. |
| 8,040,068 B2 | 10/2011 | Coumou et al. |
| 8,053,991 B2 | 11/2011 | Kim et al. |
| 8,080,168 B2 | 12/2011 | Cirigliano |
| 8,080,760 B2 | 12/2011 | Dhindsa et al. |
| 8,103,492 B2 | 1/2012 | Brcka |
| 8,264,238 B1 | 9/2012 | El-Chouelry |
| 8,271,121 B2 | 9/2012 | Venugopal et al. |
| 8,368,308 B2 | 2/2013 | Banna et al. |
| 8,404,598 B2 | 3/2013 | Liao et al. |
| 8,501,631 B2 | 8/2013 | Valcore et al. |
| 8,679,358 B2 | 3/2014 | Nakagawa |
| 8,901,935 B2 | 12/2014 | Valcore et al. |
| 2003/0082835 A1 | 5/2003 | McChesney et al. |
| 2003/0103793 A1 | 6/2003 | Murakoshi et al. |
| 2003/0119308 A1 | 6/2003 | Geefay et al. |
| 2004/0028837 A1 | 2/2004 | Fink |
| 2004/0045506 A1 | 3/2004 | Chen et al. |
| 2004/0060660 A1 | 4/2004 | Klimecky et al. |
| 2004/0061448 A1 | 4/2004 | Avoyan et al. |
| 2004/0087047 A1 | 5/2004 | Jaiswal et al. |
| 2004/0107906 A1 | 6/2004 | Collins et al. |
| 2004/0135590 A1 | 7/2004 | Quon |
| 2004/0222184 A1* | 11/2004 | Hayami et al. ............. 216/16 |
| 2004/0226657 A1 | 11/2004 | Hoffman |
| 2005/0057165 A1 | 3/2005 | Goodman |
| 2005/0090118 A1* | 4/2005 | Shannon et al. ............ 438/706 |
| 2005/0133163 A1* | 6/2005 | Shannon et al. ......... 156/345.44 |
| 2005/0134186 A1 | 6/2005 | Brouk et al. |
| 2005/0151479 A1 | 7/2005 | Avoyan et al. |
| 2005/0205532 A1 | 9/2005 | Patrick et al. |
| 2005/0217797 A1 | 10/2005 | Jafarian-Tehrani |
| 2005/0241762 A1 | 11/2005 | Paterson et al. |
| 2005/0252884 A1 | 11/2005 | Lam et al. |
| 2006/0054596 A1 | 3/2006 | Howard |
| 2006/0065623 A1 | 3/2006 | Guiney et al. |
| 2006/0065631 A1 | 3/2006 | Cheng et al. |
| 2006/0065632 A1 | 3/2006 | Cheng et al. |
| 2006/0088655 A1 | 4/2006 | Collins et al. |
| 2006/0100824 A1 | 5/2006 | Moriya |
| 2006/0169582 A1 | 8/2006 | Brown et al. |
| 2006/0231526 A1 | 10/2006 | Donohue |
| 2006/0232471 A1* | 10/2006 | Coumou ..................... 342/450 |
| 2007/0021935 A1 | 1/2007 | Larson et al. |
| 2007/0065594 A1 | 3/2007 | Chiang et al. |
| 2007/0095788 A1 | 5/2007 | Hoffman et al. |
| 2007/0127188 A1 | 6/2007 | Yang et al. |
| 2007/0247074 A1 | 10/2007 | Paterson et al. |
| 2007/0252580 A1 | 11/2007 | Dine et al. |
| 2007/0262723 A1 | 11/2007 | Ikenouchi |
| 2008/0241016 A1 | 10/2008 | Kato et al. |
| 2009/0151871 A1 | 6/2009 | Pease et al. |
| 2009/0255800 A1* | 10/2009 | Koshimizu ................. 204/164 |
| 2009/0284156 A1 | 11/2009 | Banna et al. |
| 2009/0294061 A1* | 12/2009 | Shannon et al. ......... 156/345.24 |
| 2009/0295296 A1* | 12/2009 | Shannon et al. ......... 315/111.21 |
| 2009/0308734 A1 | 12/2009 | Krauss |
| 2010/0099266 A1 | 4/2010 | Oswald et al. |
| 2010/0136793 A1 | 6/2010 | Chen et al. |
| 2010/0248488 A1 | 9/2010 | Agarwal et al. |
| 2010/0270141 A1 | 10/2010 | Carter et al. |
| 2010/0332201 A1 | 12/2010 | Albarede et al. |
| 2011/0031216 A1 | 2/2011 | Liao et al. |
| 2011/0097901 A1 | 4/2011 | Banna et al. |
| 2011/0115492 A1 | 5/2011 | Valcore, Jr. et al. |
| 2011/0118863 A1 | 5/2011 | Valcore, Jr. |
| 2011/0137446 A1 | 6/2011 | Valcore, Jr. et al. |
| 2012/0000887 A1 | 1/2012 | Eto et al. |
| 2012/0052689 A1 | 3/2012 | Tokashiki |
| 2012/0073754 A1 | 3/2012 | De la Llera et al. |
| 2012/0187844 A1 | 7/2012 | Hoffman et al. |
| 2012/0227484 A1 | 9/2012 | Chen et al. |
| 2012/0262064 A1 | 10/2012 | Nagarkatti et al. |
| 2013/0180951 A1 | 7/2013 | Indrakanti et al. |
| 2014/0062303 A1 | 3/2014 | Hoffman et al. |
| 2014/0066838 A1 | 3/2014 | Hancock |
| 2014/0076713 A1 | 3/2014 | Valcore, Jr. et al. |
| 2014/0305589 A1 | 10/2014 | Valcore, Jr. et al. |
| 2015/0002018 A1 | 1/2015 | Lill et al. |

FOREIGN PATENT DOCUMENTS

| | | | |
|---|---|---|---|
| JP | 2004239211 A | | 8/2004 |
| JP | 2004-335594 A | | 11/2004 |
| JP | 2005130198 A | * | 5/2005 |
| JP | 2005284046 A | | 10/2005 |
| KR | 10-2005-0088438 A | | 9/2005 |
| KR | 10-2005-0089995 A | | 9/2005 |
| KR | 10-2007-0031915 A | | 3/2007 |
| WO | 9914699 A1 | | 3/1999 |
| WO | 2008002938 A2 | | 1/2008 |
| WO | 2012054306 A2 | | 4/2012 |
| WO | 2014070838 A1 | | 5/2014 |

OTHER PUBLICATIONS

Electromagnetic Waves and Antennas, Sophocles J. Orfanidis, Rutgers University, Aug. 25, 2013, Chapter 10.10.

(56) References Cited

OTHER PUBLICATIONS

Darnon et al., "Synchronous Pulsed Plasma for Silicon Etch Applications", ECS Transactions, 27 (1) pp. 717-723 (2010), Publication by: The Electrochemical Society.

PCT/US2010/057478 International Search Report and Written Opinion, mailed Jul. 26, 2011 (6 pages).

PCT/US2011/063422 International Search Report and Written Opinion, mailed Mar. 28, 2012 (3 pages).

PCT/US2010/057450 International Search Report and Written Opinion, mailed Jul. 18. 2011 (9 pages).

PCT/IB2013/051010 International Search Report and Written Opinion, mailed Jul. 3, 2013 (3 pages).

Lars Christoph, Comparison of Applied Materials DPS Chambers used for poly-Si Etch process by Plasma Parameters, Dec. 6, 2000, 2nd workshop on self excited electron plasma resonance spectroscopy, Dredsen Germany.

Christoph Steuer, TOOL Comparison at GC Stack Etch in LAM TCP Using Plasma Parameters (SEERS), Dec. 12, 2000, 2nd workshop on self excited electron plasma resonance spectroscopy, Dresden Germany.

* cited by examiner

METHODS AND APPARATUS FOR SYNCHRONIZING RF PULSES IN A PLASMA PROCESSING SYSTEM

PRIORITY CLAIM

This application claims priority under 35 USC. 119(e) to a commonly-owned provisional patent application entitled "METHODS AND APPARATUS FOR SYNCHRONIZING RF PULSES IN A PLASMA PROCESSING SYSTEM", U.S. Application No. 61/602,041, filed on Feb. 22, 2012 by John C. Valcore, Jr. all of which are incorporated herein by reference.

BACKGROUND OF THE INVENTION

Plasma processing has long been employed to process substrates (e.g., wafer or flat panels or other substrates) to create electronic devices (e.g., integrated circuits or flat panel displays). In plasma processing, a substrate is disposed in a plasma processing chamber, which employs one or more electrodes to excite a source gas (which may be an etchant source gas or a deposition source gas) into a plasma for processing the substrate. The electrodes may be excited by an RF signal, which is furnished by a RF generator, for example.

In some plasma processing systems, multiple RF signals, some of which may have the same or different RF frequencies, may be provided to one or more electrodes to generate plasma. In a capacitively-coupled plasma processing system, for example, one or more RF signals may be provided to the top electrode, the bottom electrode, or both in order to generate the desired plasma.

In some applications, the RF signals may be pulsed. For any given RF signal, RF pulsing involves turning the RF signal on and off, typically within the same RF signal period but may span multiple RF signal periods. Furthermore, the RF pulsing may be synchronized among signals. For example, if two signals RF1 and RF2 are synchronized, there is an active pulse of signal RF1 for every active pulse of signal RF2. The pulses of the two RF signals may be in phase, or the leading edge of one RF pulse may lag behind the leading edge of the other RF pulse, or the trailing edge of one RF pulse may lag behind the trailing edge of the other RF pulse, or the RF pulses may be Out of phase.

In the prior art, pulsing synchronization of multiple RF signals typically involves a communication network to facilitate control communication anions the various RF generators. To facilitate discussion, FIG. 1 is as high level drawing of a generic prior art implementation of a typical pulsed RF plasma processing system 102. Pulsed RF plasma processing system 102 includes two RF generators 104 and 106. In the example of FIG. 1, RF generator 104 represents a 2 MHz generator while RF generator 106 represents a 60 MHz generator.

A host computer 110 implements tool control and receives a feedback signal 112 from an impedance matching network 114 to provide (via a digital or analog communications interface 116) power set point data to RF generator 104 and RF generator 106 via paths 118 and 120 respectively. The feedback signal 112 pertains to the impedance mismatch between the source and the load, and is employed to control either the delivered power or the forward power levels of RF generators 104 and 106 to maximize power delivery and minimize the reflected power.

Host computer 110 also provides Pulse_Enable signal 160 to a pulse synchronizer and controller 130. Responsive to the Pulse_Enable signal 160, the pulse synchronizer and controller 130 provides the synchronized control signals 170 and 172 to RF generator 104 and RF generator 106 (via External Synchronization Interfaces 140 and 142) to instruct RF generators 104 and 106 to pulse its RF signals using power controllers 150 and 152 respectively to produce pulsed RF signals 162 and 164. The pulsed RF signals 162 and 164 are then delivered to the load in plasma chamber 161 via impedance matching network 114.

Although the pulsed RF synchronization scheme of FIG. 1 can provide the synchronized pulsing function for the RF generators, there are drawbacks. For example, synchronizing the pulsing function of the various RF generators in FIG. 1 requires the use of a network to communicate among host computer 110, pulse synchronizer/controller 130, and external synchronization interfaces 140 and 142 in RF generators 104 and 106. Further, synchronizing the pulsing function of the various RF generators in FIG. 1 requires the implementation of the external synchronization interfaces such as 140 and 142) in the various generators. Implementing these external synchronization interfaces adds an extra layer of complexity to RF generator designs, and render existing RF generators incapable of being used for RF synchronized pulsing, In view of the foregoing, there are desired improved techniques and systems for implementing synchronized RF pulsing in a plasma processing system.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
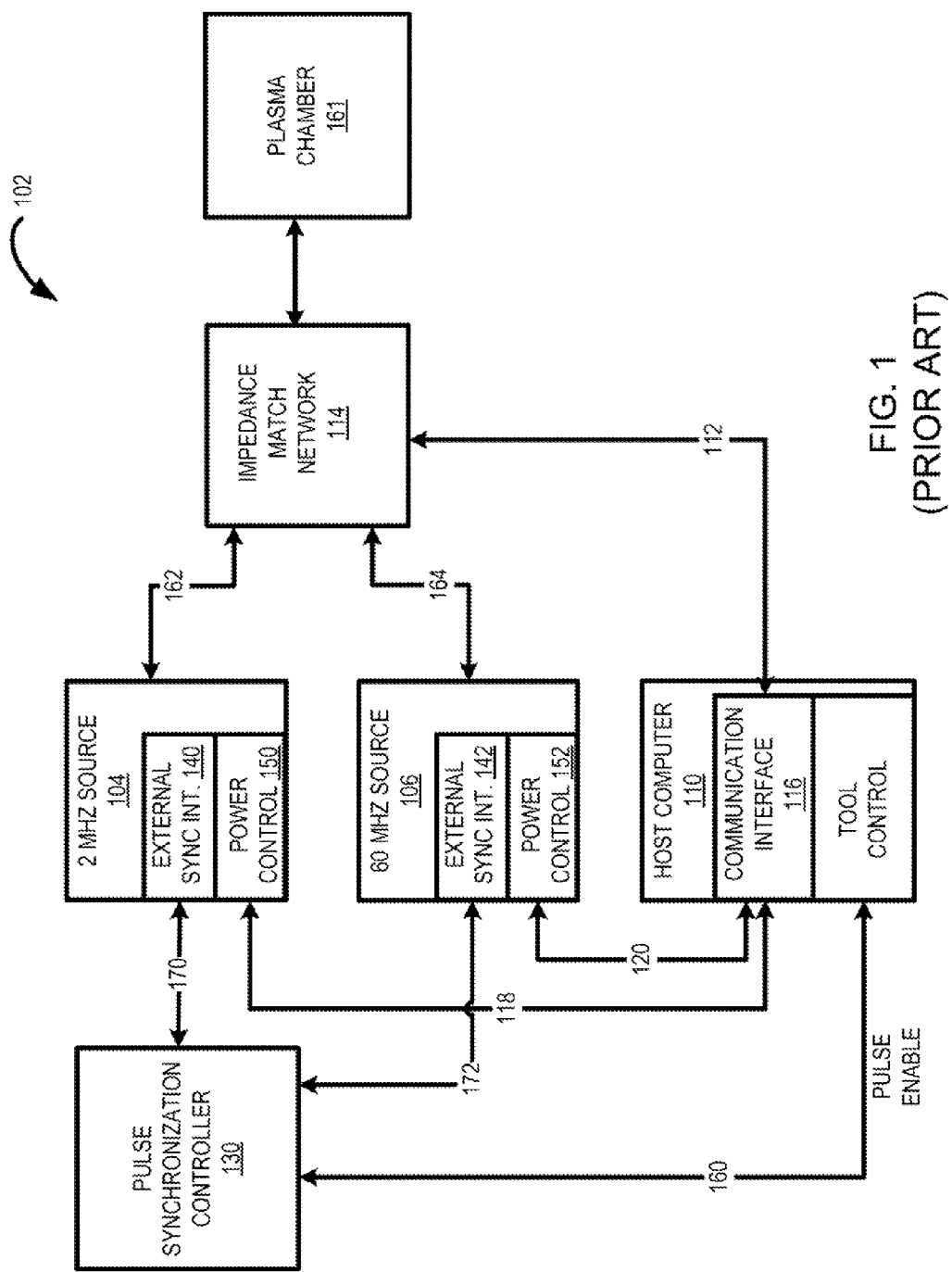
FIG. 1 is a high level drawing of a generic prior art implementation of a typical pulsed RF plasma processing system.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for implementing synchronized pulsing of RF signals in a plasma processing system having a plurality of RF generators. In one or more embodiments, one of the RF generators is designated the independent pulsing (IP) RF generator, and other RF generators are designated dependent pulsing (DP) generators.

The IP RF generator represents the RF generator that pulses independently from the DP RF generators. The IP RF generator (independent pulsing generator) generates its RF pulses responsive to a signal from the tool host or another controller. The DP RF generators (dependent pulsing generators) monitor the change in plasma impedance that is characteristic of pulsing by the IP RF generator and trigger their individual RF pulses responsive to the detected change in plasma impedance. In one or more embodiments, the change in the plasma impedance is detected by the power sensor in each of the DP RF generators, which may measure, for example, the forward and reflected RF powers.

The inventors herein recognize that existing RF generators are already provided with sensors (such as power sensors) which can monitor parameters related to the plasma impedance. When the values of these parameters change in a certain manner, a change in the plasma impedance may be detected.

To further elaborate, the efficiency with which an RF generator delivers RF power to a load depends on how well the load impedance matches with the source impedance. The more closely the load impedance matches the source impedance, the more efficient the RP power is delivered by an RF generator. Since this matching issue is well-known, many or most prior art RF generators have been provided with the ability to sense the mismatch between the source impedance and the load impedance, and to adjust the delivered or forward power in order to reduce the mismatch. The parameter gamma is typically employed to measure the load-source impedance mismatch. A gamma value of zero indicates perfect matching while a gamma value of 1 indicates a high degree of mismatch. In some RF generators: this gamma value is calculated from values provided by the power sensor, which detects the source and reflected RF powers.

The inventors herein further realize that the plasma impedance is a function of power delivered to the plasma. When a given RF generator (referred to herein as the independent pulsing or IP RF generator) pulses, the delivered RF power changes, and the plasma impedance changes accordingly. Other RF generators (referred to herein as dependent pulsing or DP RP generators) react to this change in the plasma impedance by varying their power output to match their source impedance with the plasma (or load) impedance.

The detection of changes in the plasma impedance typically relies on the measurement of one or more parameters whose values can be analyzed to directly or indirectly ascertain changes in the plasma impedance. If the plasma impedance change caused by RF pulsing of the IP RF generator can be detected by other RF venerators, and more importantly, if this detection can be used to trigger RF pulsing by these other RF generators, synchronized pulsing can be achieved without the need to explicitly link the RF generators via a control network as is done in the prior art.

Figure 2:
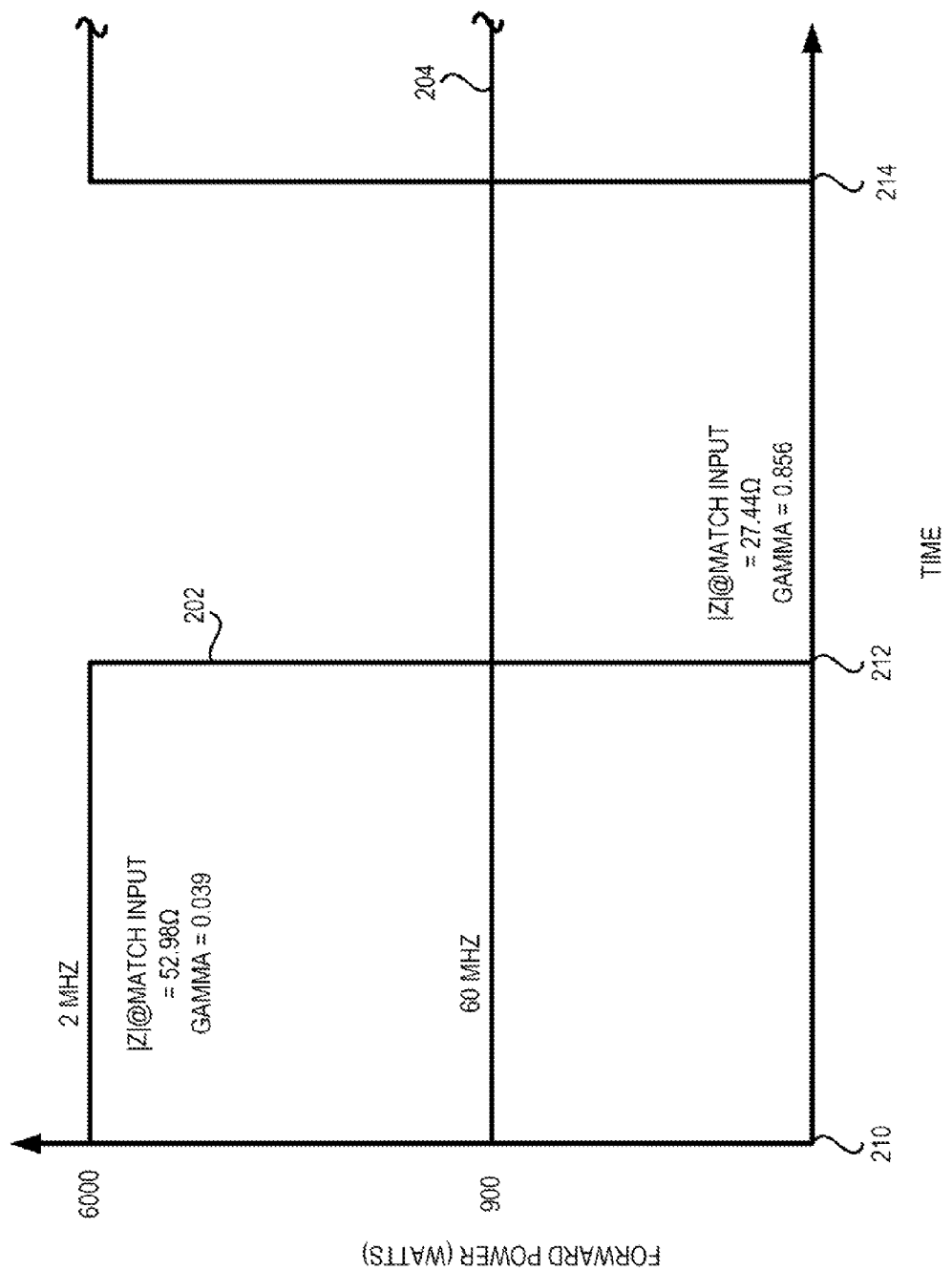
FIG. 2 shows a timing diagram of the pulsing of a 2 MHz RF signal to illustrate the change in gamma value for one RF generator when another RF generator pulses its RF signal.

To illustrate the change in gamma value for one RF generator when another RF generator pulses its RF signal, FIG. 2 shows a timing diagram of the pulsing of a 2 MHz RF signal 202, which is pulsed at 159 Hz, with a 50% duty cycle. In the example of FIG. 2, two RF veneators are involved: a 2 MHz RF generator outputting 6000 Watts RF signal and a 60 MHz RF generator outputting a 900 Watts RF signal. The 2 MHz RF signal is pulsed between 6000 Watts and 0 Watts, as discussed, while the 60 MHz RF signal (204) is not pulsed.

When the 2 MHz RF signal 202 is active from reference number 210 to 212), the RF power sensor of the 60 MHz RF generator reacts to the plasma impedance value caused by the high 2 MHz RF signal 202. In this case, the real value of the impedance at the match input (generator output) of the 60 MHz RF generator is 52.9 ohms. The gamma value, which describes the source-load impedance mismatch, is 0.039.

When the 2 MHz RF signal 202 is inactive (from reference number 212 to 214), the RF power sensor of the 60 MHz RF generator reacts to the plasma impedance caused by the low 2 MHz RF signal 202. In this case, the real value of the impedance at the match input (generator output) of the 60 MHz RF generator is only 27.44 ohms. The gamma value, which describes the source-load impedance mismatch, is 0.856.

As can be seen in the example of FIG. 2, either the impedance at the match input or the gamma value may be monitored and if a change occurs from the value reflective of the "on" state of the 2 MHz RF signal 202 to the value reflective of the "off" state of the 2 MHz RF signal 202 (or vice versa), the detection of such change may be employed as a trigger signal to a circuit to generate an RF pulse for the 60 MHz signal of the 60 MHz DP RF generator. If there are other DP RF generators, each DP RF generator may monitor the plasma impedance (e.g., a parameter that is directly or indirectly reflective of this plasma impedance) and use the detection of plasma impedance change to trigger pulse generation. In this manner, no explicit control network between a master control circuit/device (such as from host computer 110 or pulse synchronization controller circuit 130) and the various RF generators is needed. Further, the RF generators do not require any additional circuitry to interface with the control network (such as external synchronization interface circuits 140 and 142 of FIG. 1).

Instead, only one RF generator (the IP RF generator such as the 2 MHz IP RF generator in the example) needs to be explicitly controlled for RF pulsing. Other RF generators (the DP RF generators) leverage on existing detection circuitry (which is traditionally used to monitor the forward and reflected RF power for adjusting the power set point for RF delivery to match the source impedance to the load impedance) in order to indirectly detect when the IP generator RF signal has pulsed. This detection provides a triggering signal to the DP RF generators to allow the DP RF generators to generate their own RF pulses in response to the detection of RF pulsing by the IP RF generator. In this manner, vastly more simplified synchronized pulsing is accomplished.

Figure 3:
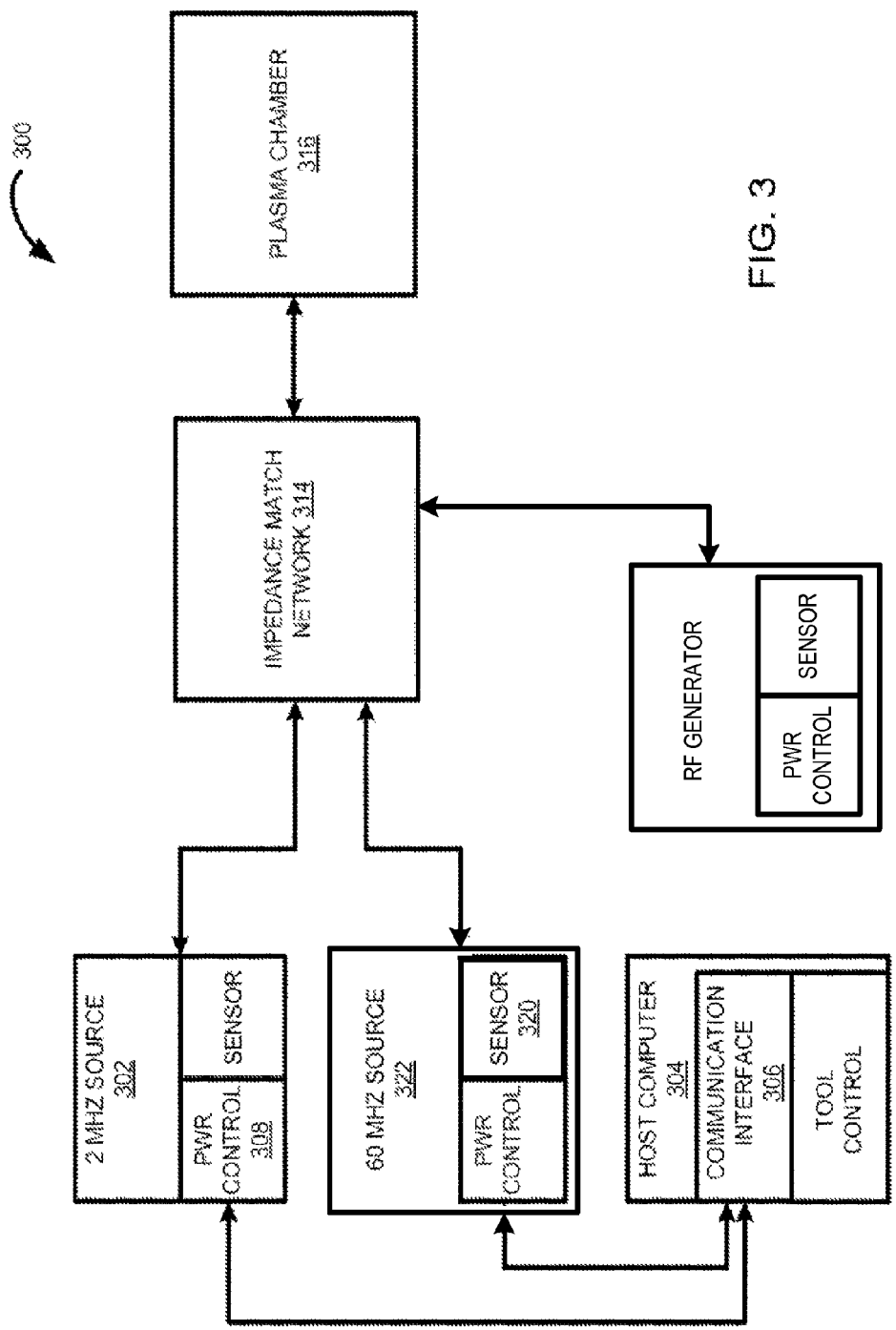
FIG. 3 shows a simplified circuit block diagram of an implementation of the synchronized pulsing RF, in accordance with an embodiment of the invention.

The features and advantages of embodiments of the invention may be better understood with reference to the figures and discussions that follow. FIG. 3 shows a simplified circuit block diagram of an implementation of the synchronized pulsing RF 300, in accordance with an embodiment of the invention. In FIG. 3, RF generator 302 represents the IP RF generator and receives its pulsing control signal from tool host computer 304 (via digital/analog communications interface 306). IP RF generator 302 then generates, using power controller 308, an RF pulse using a power setpoint provided by tool host computer 304. The pulse is furnished to impedance matching network 314 to energize the RF-driven plasma chamber 316. The plasma impedance in RF-driven plasma chamber 316 changes as a result of the on-state of the 2 MHz pulse from IP RF generator 302.

This plasma impedance change is then detected by RF sensor 320 of DP RF generator 322. By way of example, the forward and reflected power of the DP 60 MHZ RF generator 322 may be monitored. Generally an IP_RF_Pulse_High threshold value may be employed to determine when the 2 MHz pulse from the IP RF generator 302 is deemed to be high. In an embodiment, the gamma value obtained from measurements taken by RF sensor 320 is employed and compared against the aforementioned IP_RF_Pulse_High value. Once the 2 MHz pulse from the IP RF generator 302 is deemed to be on, pulse generation circuit associated with DP RF generator 322 may be employed to generate a pulse for the 60 MHz signal from DP RF generator 322.

The pulse from DP RF generator 322 may be set to stay on for a predefined duration (e.g., in accordance with some duty cycle specification) or may be synchronized to turn off when the 2 MHz pulse from IP RF generator 302 transitions from a high state to a low state (by monitoring the plasma impedance state in the manner discussed earlier).

Figure 4:
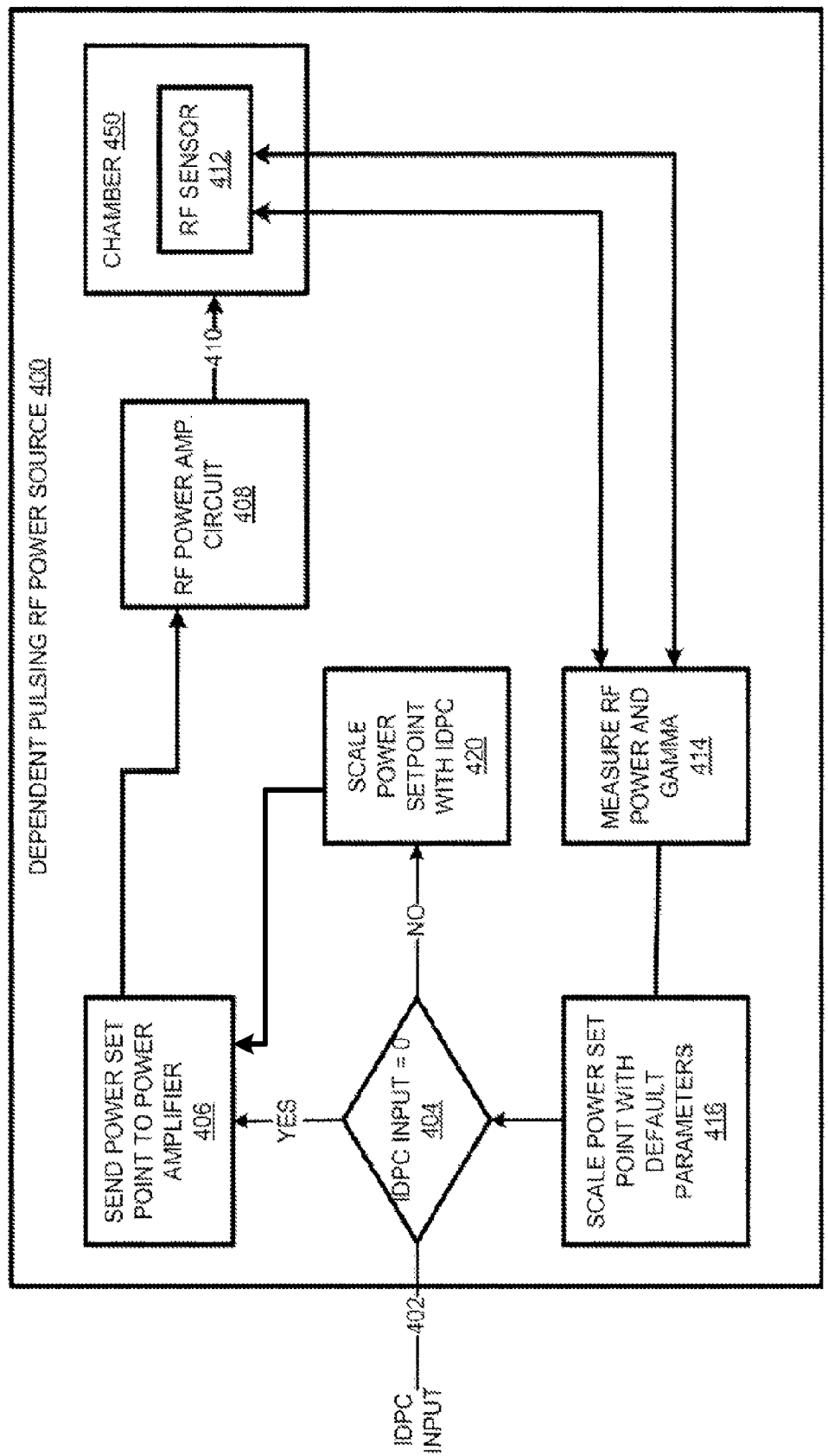
FIG. 4 is an example implementation of a DP RF generator for providing the synchronized RF pulsing capability, in accordance with an embodiment of the invention.

FIG. 4 is an example implementation of a DP RF generator 400 for providing the synchronized RF pulsing capability. In FIG. 4, a signal 402 is provided from the tool host, which signal may include two additional values: a trigger threshold and a gain value. The trigger threshold represents the predefined value for triggering the RF pulse for the DP generator (which keys off the plasma impedance change caused by the independent pulsing generator). By way of example, if the gamma value is monitored by the DP RF generator for detecting the plasma impedance change due to the pulsing of the ZIP RF generator, the threshold value may represent the gamma value which, when traversed, represents the triggering signal for triggering the RF pulse by the DP RF generator. The gain value represents a value for scaling the signal to provide the high level and the low level of the RF pulse by the DP RF generator (since it is possible that different power levels may be desired for high and low instead of full-on or full-off).

Returning now to FIG. 4, if the IDPC input is zero (block 404, signifying that the chamber is not operating in the RF pulsing mode), the RF pulsing functionality is bypassed in the example of FIG. 4. In this case, the default power set point (normally furnished by the tool host computer to govern the power output by the RF generator) is sent to the power amplifier (block 406) and amplified via the RF power amplifier 408, which is then output to the plasma chamber 450 via path 410.

The RF sensors 412 monitors the forward and reflected powers in the example of FIG. 4, and provides these values to logic circuit 414 in order to permit default scaling circuit 416 to scale the power set point to optimize power delivery. For example, if the gamma value is too high (indicating a large mismatch between the forward and reflected power), the power set point provided by the tool host may be increased or decreased as necessary to optimize power delivery to the plasma load.

However, if the IDPC input is not, equal to zero (block 404, signifying that the chamber is operating in the RF pulsing mode), the RF pulsing functionality is enabled in the example of FIG. 4 (via pulse power scaling circuit 420). In this case, the power set point (furnished by the tool host computer to govern the power output by the RF generator and is part of the IDPC input in this case) is sent to the pulse power scaling circuit 420. The scaling may toggle between two values, high and low, depending on the detection of the plasma impedance by RF sensor 412 and logic circuit 414.

Suppose RF sensor 412 and logic circuit 414 detect that the gamma value has traversed the trigger threshold value provided with signal 402, this information is provided to pulse power scaling circuit 420, which then scales the default power set point scaling to reflect the high RF pulse state. Once pulse scaling is complete (block 420), the newly scaled power setpoint is then sent to block 408 for RF amplification (via block 406) and the high RF pulse level is sent to the plasma, chamber. To implement a low pulse, another scaling value may be employed by block 420 (e.g., upon detection of the low pulse of the IP RF generator or after a predefined duration of time has past since the DP RF pulse went high) to generate a low RF pulse level to be sent to the plasma chamber.

In an embodiment, a generalized method for synchronizing RF pulsing may involve independent pulsing at least one RF power supply (the IP RF power supply). Each of the other RF supplies may then monitor for indicia of plasma impedance change (such as gamma value, forward power, reflected power, VI probe measurement, real and/or complex values of the generator output impedance, etc.). In other words, detection that the plasma impedance has changed in a manner that is characteristic of pulsing by the independent pulsing RF generator is not limited to gamma monitoring.

In an advantageous example, the DP RF generators may analyze VI probe measurements and/or phase information received from the chamber in order to detect plasma impedance change that is characteristic of pulsing by the independent pulsing RF generator. Upon detection that the plasma impedance has changed in a manner that is characteristic of pulsing by the independent pulsing RF generator (e.g., from low to high or high to low), the dependent RF power supply may use that detection as a trigger to generate its pulse. The high RF pulse of the dependent RF generator may persist for a predefined period of time, or the RF pulse of the dependent RF generator may transition to a low value upon detecting that the independent pulsing RF signal has transitioned to a low state.

As can be appreciated from the foregoing, embodiments of the invention detects plasma impedance change that is characteristic of pulsing events by the independent pulsing RF generator and employs the detection as a trigger signal to pulse the dependent pulsing RF generator. In this manner, complicated networks and interfaces are no longer necessary to synchronize pulsing among a plurality of RF generators.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus Should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A synchronized pulsing arrangement comprising:
a first RF generator for providing a first RF signal, said first RF signal provided to a plasma processing chamber to energize plasma therein, said first RF signal representing a pulsing RF signal; and
a second RF generator for providing a second RF signal to said plasma processing chamber, said second RF generator having a sensor subsystem for detecting at an output of the second RF generator values of at least one parameter associated with said plasma processing chamber indicating a change in pulsing of said first RF signal from a first state to a second state, said second RF generator having a pulse controlling subsystem for pulsing said second RF signal provided by the second RF generator in response to detecting that the values of said at least one parameter at the output of the second RF generator indicate a change in pulsing of said first RF signal from the first state to the second state,
wherein the first RF signal in the first state has a different forward power level from a forward power level of the first RF signal in the second state,
wherein the first RF generator and the sensor subsystem of the second RF generator are coupled to an impedance matching network.

2. The synchronized pulsing arrangement of claim 1, wherein said sensor subsystem of the second RF generator is configured to detect the at least one parameter that represents at least one of forward RF power and reflected RF power.

3. The synchronized pulsing arrangement of claim 1, wherein said sensor subsystem of the second RF generator is configured to detect the at least one parameter that represents gamma that further represents a numerical index indicating a degree of mismatch between reflected power and forward power of said second RF generator.

4. The synchronized pulsing arrangement of claim 1, further comprising a tool host computer, said tool host computer providing at least a trigger threshold value to enable circuitry in said sensor subsystem of said second RF generator to ascertain whether said first RF signal is pulsed from the first state to the second state.

5. The synchronized pulsing arrangement of claim 4, wherein said pulse controlling subsystem is configured to generate at least a high level and a low level for said second RF signal, said high level and said low level governed by at least one value provided said tool host computer.

6. The synchronized pulsing arrangement of claim 1, wherein said second RF generator is configured to generate the second RF signal that has at least a high pulse value and a non-zero low pulse value.

7. The synchronized pulsing arrangement of claim 1, wherein said sensor subsystem of the second RF generator is configured to detect the at least one parameter that represents the values obtained from a VI probe.

8. The synchronized pulsing arrangement of claim 1, wherein said sensor subsystem of the second RF generator is configured to detect the at least one parameter that represents an output impedance of said second RF generator.

9. The synchronized pulsing arrangement of claim 1, wherein the impedance matching network is coupled to outputs of said first RF generator and said second RF generator, wherein said sensor subsystem of the second RF generator is configured to detect the at least one parameter that represents an impedance of an input of said impedance matching network.

10. The synchronized pulsing arrangement of claim 1, wherein said second RF generator is configured to generate the second RF signal that includes at least a predefined high pulse value and a predefined low pulse value.

11. The synchronized pulsing arrangement of claim 10, further comprising control circuitry for generating a pulse control signal to control pulsing by said first RF generator and wherein said second RF generator does not pulse responsive to a signal from said control circuitry, said second RF generator pulses at least one of high-to-low and low-to-high responsive to said detecting said values of said at least one parameter associated with said plasma processing chamber that reflects whether said first RF signal is pulsed high or pulsed low.

12. The synchronized pulsing arrangement of claim 1, wherein said second RF generator is configured to generate the second RF signal that has at least a predefined high pulse value and a predefined low pulse value and wherein second RF generator is configured to generate the second RF signal that transitions, after a predefined duration expires after being pulsed from said predefined low pulse value to said predefined high pulse value, to said predefined pulse low value.

13. The synchronized pulsing arrangement of claim 1, wherein said second RF generator is configured to generate the second RF signal that includes at least a predefined high pulse value and a predefined low pulse value and wherein said second RF generator is configured to generate the second RF signal that transitions, after a predefined duration expires after being pulsed from said predefined high pulse value to said predefined low pulse value, to said predefined high pulse value.

14. A synchronized pulsing arrangement comprising:
a first RF generator for providing a first RF signal, said first RF signal provided to a plasma processing chamber to energize plasma therein, said first RF signal representing a pulsing RF signal;
control circuitry for generating a pulse control signal to control pulsing by said first RF generator;
a second RF generator for providing a second RF signal to said plasma processing chamber, said second RF generator having a sensor subsystem for detecting at an output of the second RF generator values of at least one parameter associated with said plasma processing chamber indicating a change in pulsing of said first RF signal from a first state to a second state, said second RF generator having a pulse controlling subsystem for pulsing said second RF signal provided by the second RF generator in response to detecting that the values of said at least one parameter at the output of the second RF generator indicate a change in pulsing of said first RF signal from the first state to the second state, wherein the first RF signal in the first state has a different forward power range level from a forward power level of the first RF signal in the second state,
wherein the first RF generator and the sensor subsystem of the second RF generator are coupled to an impedance matching network; and
a third RF generator for providing a third RF signal to said plasma processing chamber, said third RF generator having a sensor subsystem for detecting values at an output of the third RF generator of said at least one parameter associated with said plasma processing chamber indicating a change in pulsing of said first RF signal from the first state to the second state, said third RF generator having a pulse controlling subsystem for pulsing said third RF signal provided by the third RF generator in response to detecting that the values of said at least one parameter at the output of the third RF generator indicate a change in pulsing of said first RF signal from the first state to the second state, wherein said second RF generator does not pulse responsive to a signal from said control circuitry, said second RF generator pulses said second RF signal at least one of high-to-low and low-to-high responsive to said detecting said values of said at least one parameter associated with said plasma processing chamber, and wherein said third RF generator does not pulse responsive to the signal from said control circuitry, said third RF generator pulses said third RF signal at least one of high-to-low and low-to-high responsive to said detecting said values of said at least one parameter associated with said plasma processing chamber.

15. The synchronized pulsing arrangement of claim 14, wherein said sensor subsystem of the second RF generator is configured to detect the at least one parameter that represents at least one of forward RF power and reflected RF power.

16. The synchronized pulsing arrangement of claim 14, wherein said sensor subsystem of the second RF generator is configured to detect the at least one parameter that represents gamma that further represents a numerical index indicating a degree of mismatch between reflected power and forward power of said second RF generator.

17. The synchronized pulsing arrangement of claim 14, wherein said sensor subsystem of the second RF generator compares said values of said at least said one parameter associated with said plasma processing chamber with a threshold value to ascertain when to pulse said second RF signal.

18. The synchronized pulsing arrangement of claim 14, wherein said second RF generator is configured to generate the second RF signal that has at least a high pulse value and a non-zero low pulse value.

19. The synchronized pulsing arrangement of claim 14, wherein said second RF generator is configured to generate the second RF signal that has at least a predefined high pulse value and a predefined low pulse value.

20. The synchronized pulsing arrangement of claim 14, wherein said sensor subsystem of the second RF generator is configured to detect the at least one parameter that represents the values obtained from a VI probe.

21. The synchronized pulsing arrangement of claim 14, wherein said sensor subsystem of the second RF generator is configured to detect the at least one parameter that represents an output impedance of said second RF generator.

22. The synchronized pulsing arrangement of claim 14, wherein the impedance matching network is coupled to outputs of said first RF generator and said second RF generator, wherein said at least one parameter represents an impedance of an input of said impedance matching network.

23. The synchronized pulsing arrangement of claim 14, wherein said second RF generator is configured to generate the second RF signal that has at least a predefined high pulse value and a predefined low pulse value and wherein said second RF signal generator is configured to generate the second RF signal that transitions, after a predefined duration expires after being pulsed from said predefined low pulse value to said predefined high pulse value, to said predefined low pulse value.

24. A system comprising:
a first RF generator for generating a first RF signal;
a second RF generator for generating a second RF signal at an output;
a third RF generator for generating a third RF signal at an output;
an impedance matching network connected to the first RF generator for receiving the first RF signal, the impedance matching network connected to the second RF generator for receiving the second RF signal;
a plasma processing chamber coupled to the impedance matching network;
control circuitry coupled to the first RF generator for generating a pulse control signal to control pulsing by the first RF generator;
the second RF generator having a sensor subsystem for detecting at the output of the second RF generator values of a parameter associated with the plasma processing chamber indicating a change in pulsing of the first RF signal from a first state to a second state, the first RF signal in the first state having a different forward power level from a forward power level of the first RF signal in the second state,
the second RF generator having an RF generator pulse controlling subsystem for pulsing the second RF signal generated by the second RF generator in response to detecting that the values of the parameter at the output of the second RF generator indicate a change in pulsing of the first RF signal from the first state to the second state,
the third RF generator having a sensor subsystem for detecting values at the output of the third RF generator of the parameter associated with the plasma processing chamber indicating a change in pulsing of the first RF signal from the first state to the second state,
the third RF generator having an RF generator pulse controlling subsystem for pulsing the third RF signal generated by the third RF generator in response to detecting that the values of the parameter at the output of the third RF generator indicate a change in pulsing of the first RF signal from the first state to the second state.

25. The system of claim 24, wherein the second RF generator is configured to compare the value of the parameter to a pre-determined trigger threshold value to determine that the first RF generator pulsed from the first state to the second state.

26. The system of claim 24, wherein the first RF generator is configured not to pulse the first RF signal based on the pulsing of the second RF generator and the pulsing of the third RF generator.

27. The system of claim 4, wherein the second RF generator is configured to scale the second RF signal from a low level to a high level upon determining that the first RF generator pulsed from the first state to the second state, wherein the second RF generator is configured to scale the second RF signal from the high level to the low level upon determining that the first RF generator pulsed from the second state to the first state.

* * * * *